United States Patent [19]
Doan et al.

[11] Patent Number: 5,618,381
[45] Date of Patent: Apr. 8, 1997

[54] MULTIPLE STEP METHOD OF CHEMICAL-MECHANICAL POLISHING WHICH MINIMIZES DISHING

[75] Inventors: Trung T. Doan; Chris C. Yu, both of Boise, Id.

[73] Assignee: Micron Technology, Inc., Boise, Id.

[21] Appl. No.: 3,920

[22] Filed: Jan. 12, 1993

Related U.S. Application Data

[63] Continuation of Ser. No. 866,378, Apr. 9, 1992, abandoned, which is a continuation-in-part of Ser. No. 824,980, Jan. 24, 1992, Pat. No. 5,244,534.

[51] Int. Cl.⁶ ........................................... H01L 21/306
[52] U.S. Cl. ........................ 438/633; 438/693; 438/672
[58] Field of Search .................... 156/636.1, 645; 437/228, 235, 195, 190, 192, 245, 246

[56] References Cited

U.S. PATENT DOCUMENTS

| | | | |
|---|---|---|---|
| 3,841,031 | 10/1974 | Walsh | 51/283 |
| 4,193,226 | 3/1980 | Gill, Jr. et al. | 51/124 |
| 4,811,522 | 3/1989 | Gill, Jr. | 51/131.1 |
| 5,065,273 | 3/1991 | Rajeevakumar | 437/52 |

Primary Examiner—Charles L. Bowers, Jr.
Assistant Examiner—Lynne A. Gurley
Attorney, Agent, or Firm—Wells, St. John, Roberts, Gregory & Matkin P.S.

[57] ABSTRACT

Disclosed is a method for planarizing a metal surface and forming coplanar metal and dielectric layer surfaces with a minimized degree of dishing (metal recess in an oxide cavity or trough) which results from the uneven polishing with a polishing pad. A cavity is formed in a substrate material, such as oxide, and a layer of conductive material such as metal is formed over the cavity and other surfaces of the substrate. Next, a protective layer of material such as silicon dioxide, borophosphosilicate glass (BPSG), silicon nitride, or tetraethylorthosilicate (TEOS), or any insulator or conductor which can be removed at a slower rate than the conductive layer, is formed over the metal surface, the protective layer being not as easily polished as the metal in a chemical mechanical polishing (CMP) process optimized for metal polishing. A first CMP process removes a portion of the protective layer from the underlying metal overburden. A second CMP process, which removes the metal at a greater rate than the protective layer, prevents the polishing pad from dishing metal film in the areas having larger metal features such as large metal buses and bond pads.

11 Claims, 5 Drawing Sheets

MULTIPLE STEP METHOD OF CHEMICAL-MECHANICAL POLISHING WHICH MINIMIZES DISHING

CROSS-REFERENCE TO RELATED APPLICATIONS

This application is a continuation-in-part of U.S. patent application Ser. No. 07/866,378, filed Apr. 9, 1992, now abandoned, which is a continuation-in-part of U.S. patent application Ser. No. 07/824,980, filed Jan. 24, 1992 now U.S. Pat. No. 5,244,534.

FIELD OF THE INVENTION

The disclosed invention relates to the field of semiconductor manufacture. More specifically, a procedure for forming conductive features on a wafer surface is described which reduces the amount of concavity (dishing).

BACKGROUND OF THE INVENTION

Integrated circuits are chemically and physically integrated into a substrate, such as a silicon or gallium arsenide wafer, by patterning regions in the substrate, and by patterning layers on the substrate. These regions and layers can be conductive, for conductive path and bond pad fabrication. They can also be of different conductivity types, which is essential for transistor and diode fabrication. Up to a thousand or more devices are formed simultaneously on the surface of a single wafer of semiconductor material.

For high density devices of submicron feature sizes it is essential to start with a flat semiconductor wafer and to maintain a planarized surface at various fabrication steps. If the process steps of device fabrication are performed on a wafer surface that is not uniform and planarized, various problems can occur which may result in a large number of inoperable devices.

Methods used to ensure the wafer surface planarity included forming an oxide such as borophosphosilicate glass (BPSG) layer on the wafer surface, then heating the wafer to reflow and planarize the oxide layer. This "reflow" method of planarizing the wafer surface was sufficient with fairly large device geometries, but as the technology allowed for smaller device feature sizes, this method produced unsatisfactory results.

Another method which has been used to produce a planar wafer surface is to use the oxide reflow method described above, then spin coat the wafer with photoresist. The spin coating of the material on the wafer surface fills the low points and produces a planar surface from which to start. Next, a dry etch, which removes photoresist and oxide at a rate sufficiently close to 1:1, removes the photoresist and the high points of the wafer, thereby producing a planar oxide layer on the wafer surface.

Most recently, chemical mechanical planarization (CMP) processes have been used to planarize the surface of wafers in preparation for device fabrication. The CMP process involves holding a thin flat wafer of semiconductor material against a rotating wetted polishing pad surface under a controlled downward pressure. A polishing slurry such as a mixture of either a basic or acidic solution used as a chemical etch component in combination with alumina or silica particles may be used. A rotating polishing head or wafer carrier is typically used to hold the wafer under controlled pressure against a rotating polishing platen. The polishing platen is typically covered with a polishing pad material such as blown polyurethane.

Such apparatus for polishing thin flat semiconductor wafers are well known in the art. U.S. Pat. Nos. 4,193,226 and 4,811,522 to Gill, Jr. and U.S. Pat. No. 3,841,031 to Walsh, for instance, disclose such apparatus.

Deposited conductors are an integral part of every integrated circuit, and interconnect lines formed from conductive materials provide the role of surface wiring to conduct current. Specifically, the deposited conductors are used to electrically couple various components that are formed in the surface of the wafer, and also for use as bond pads for the semiconductor device. A recent development in producing these metal features is to use a damascene procedure, as described in U.S. Pat. No. 5,065,273 by Rajeevakumar. A damascene process produces conductive interconnects and other features which are directly defined by chemical mechanical planarization without a reactive ion etch (RIE) process, and has the potential to fabricate submicron geometry interconnects. A conventional damascene process, as shown in FIGS. 1–3, begins by forming a dielectric 10, such as oxide, over a wafer substrate 12. The dielectric 10 is patterned, for example using lithography to form a photoresist layer 14. Referring to FIG. 2, "troughs" 20 are formed in the dielectric 10 defined on two sides by the dielectric, and on the bottom by the substrate 12 or a barrier layer (not shown) as described below. A conformal blanket layer of conductive material 22 such as doped polycrystalline silicon or a metal such as copper or tungsten is deposited over the wafer surface. Finally, the wafer surface is polished thereby removing the conductive material overburden while leaving the conductive material 30 in the planar dielectric surface 10 as shown in FIG. 3.

FIG. 4 shows another feature which can be formed with a similar damascene process. A contact hole 40 in a dielectric 10 (such as oxide) to an active area 42 of the substrate 12 is plugged with a conductive material 44 such as tungsten. A conductive line (not shown) is then contacted to the metal plug 44.

One problem that occurs during the fabrication of a semiconductor device using damascene of a conductive material such as copper or tungsten is "dishing" of the comparatively large bond pads, contacts, and other large metal surfaces. FIG. 5 shows a top view optical micrograph of the dishing 50 in a tungsten film which can occur on a bond pad 52 using a normal damascene process. The dishing 50 occurs as the polishing pad removes more of the material at the center of the large feature than at the outer edges. Due to the elasticity of the polishing pad, polishing will continue at the bond pads 52 and other large metal feature areas when the metal and dielectric substrate interface is reached during a CMP process. The material in the middle of the feature, therefore, is thinner than at the edges. In extreme cases, the material in the middle of the feature can be completely abraded away by the polishing pad. The bond pad 52 overlies a nonconductive substrate 54, so soldering the bond wire to a bond pad having this dishing effect produces a physically and electrically weak coupling. The electrical resistance can be increased as the surface area of the contact between the bond wire and the bond pad is greatly decreased.

A need remains for improved methods of forming conductive features on semiconductor wafers using a damascene procedure which reduces or eliminates dishing of the feature surface.

SUMMARY OF THE INVENTION

An object of the invention is to reduce the dishing of large conductive material features which occurs during a damascene polishing process. This object of the invention was realized by forming a patterned layer of material such as oxide, then a blanket layer of conductive material was deposited. A protective layer of material such as BPSG or tetraethylorthosilicate (TEOS), or any insulator or conductor which can be removed at a slower rate than the conductive layer, was formed over the conductive layer. The protective layer in the protruding areas (the "high" points) was removed by a CMP process using a hard polishing pad (low mechanical compressibility) wetted with a polishing slurry suitable for the protective layer polishing. Finally, a slurry was used to remove the metal at a higher rate than the removal of the protective layer. The remaining protective layer at the "low" points slowed the polishing process, and resulted in a metal feature wherein the dishing was greatly reduced.

It should be emphasized that the drawings of the instant application are not to scale but are merely schematic representations and are not intended to portray the specific parameters or the structural details of the invention, which can be determined by one of skill in the art by examination of the information herein along.

DETAILED DESCRIPTION OF THE INVENTION

The inventive damascene process was accomplished with the following steps. Other variations are noted, and still other variations and steps are possible and likely by reviewing the information herein.

First, the surface of a substrate of BPSG was planarized using conventional CMP methods. Other workable methods are possible, and TEOS can be used for the substrate. The surface was planarized so that a variation of no more than ±1000 Å deviation from the mean thickness was achieved.

Figure 1:
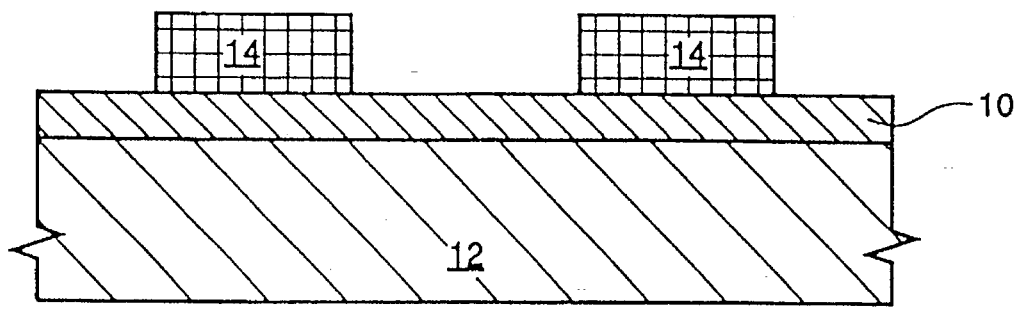
FIG. 1 is a cross section of a first structure formed during a damascene process to form conductive features.
Figure 2:
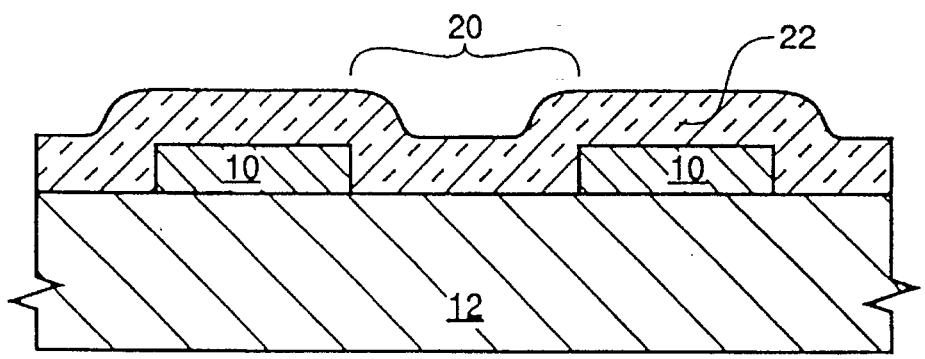
FIG. 2 is a cross section of the FIG. 1 structure after etching of the dielectric layer and addition of a metal layer.

Next, the dielectric was patterned using lithography and etch techniques which defined the boundaries of the conductive material resulting in the structure of FIG. 2. Such a patterned dielectric layer typically consists of contact openings and troughs into which metal interconnects are to be formed. To form a bond pad, the oxide structures protruded from the wafer surface (12 in FIG. 3) by approximately 1 to 3 micrometers ($\mu$m), this also being the eventual thickness of the bond pads.

Adhesion or barrier layers of titanium, titanium nitride, and/or titanium tungsten were deposited (not shown). A layer of conductive material, tungsten in the instant case, was formed on the substrate surface by CVD. In the ideal process, the top surface of the conductive material should be even with the top surface of the dielectric. Copper, aluminum, or doped polycrystalline silicon are three other possible materials to form the conductive structures, and other materials may prove sufficient. The tungsten of the instant case was approximately 1 $\mu$m thick.

Figure 6:
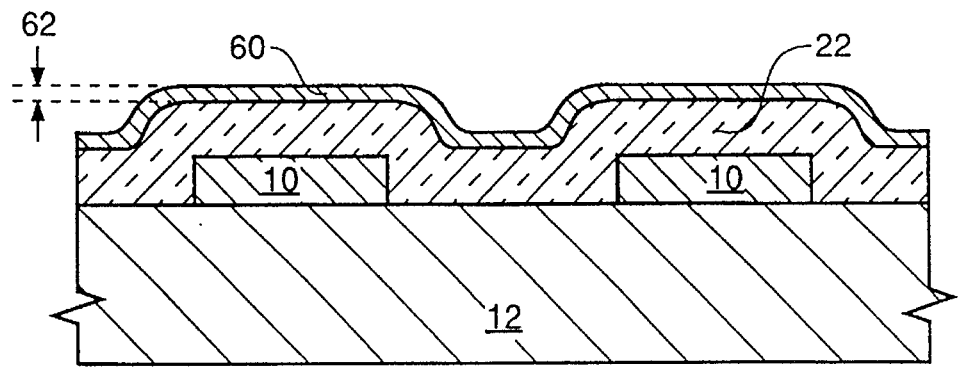
FIG. 6 is a cross section showing the result of a step of the inventive process, a protective layer.
Figure 7:
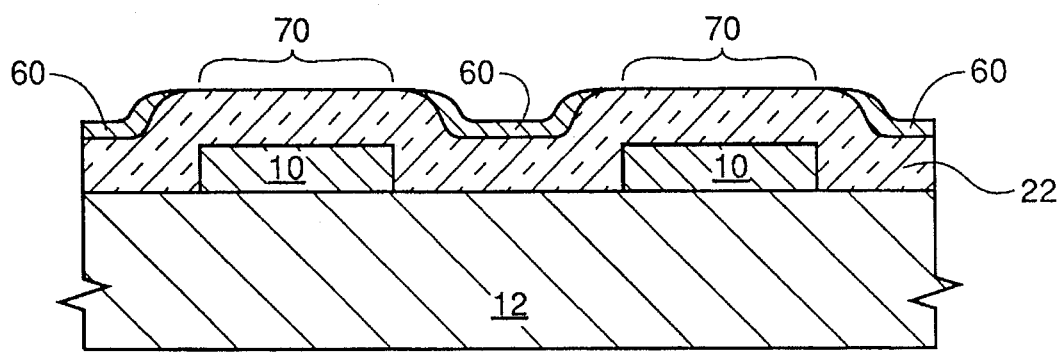
FIG. 7 is a cross section of the structure of FIG. 6 after removal of a portion of the protective layer to bare the underlying conductive layer.

Next, referring to FIG. 6, a thin layer of TEOS 60 was formed over the tungsten blanket layer 22. A TEOS layer 60 between 500 Å and 5 KÅ is sufficient, and other thicknesses are possible. The most protruding areas 62 of the TEOS layer 60 were then removed with a CMP process with a slurry containing a silicon oxide abrasive to expose the underlying tungsten 22. Ideally, the tungsten 22 is not etched at this step, although some etching is probable. Referring to FIG. 7, this CMP step results in areas of bare tungsten 70, while other areas of the tungsten layer 22 remain covered by the protective layer 60. BPSG, therefore silicon nitride, titanium, titanium nitride, tungsten, titanium tungsten, molybdenum, tantalum, and tantalum nitride also function sufficiently as the protective layer. Generally, any material which can be removed at a rate slower than that of the conductive layer 72 would function sufficiently as the protective layer.

Figure 3:
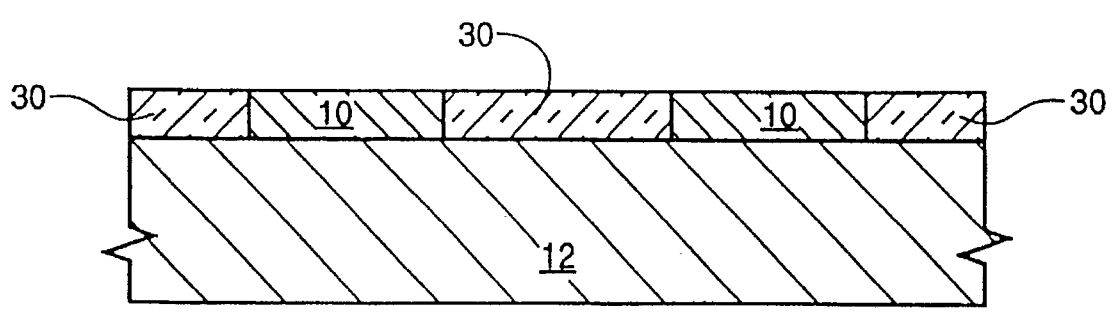
FIG. 3 is a cross section of the FIG. 2 structure after planarization of the metal layer.
Figure 4:
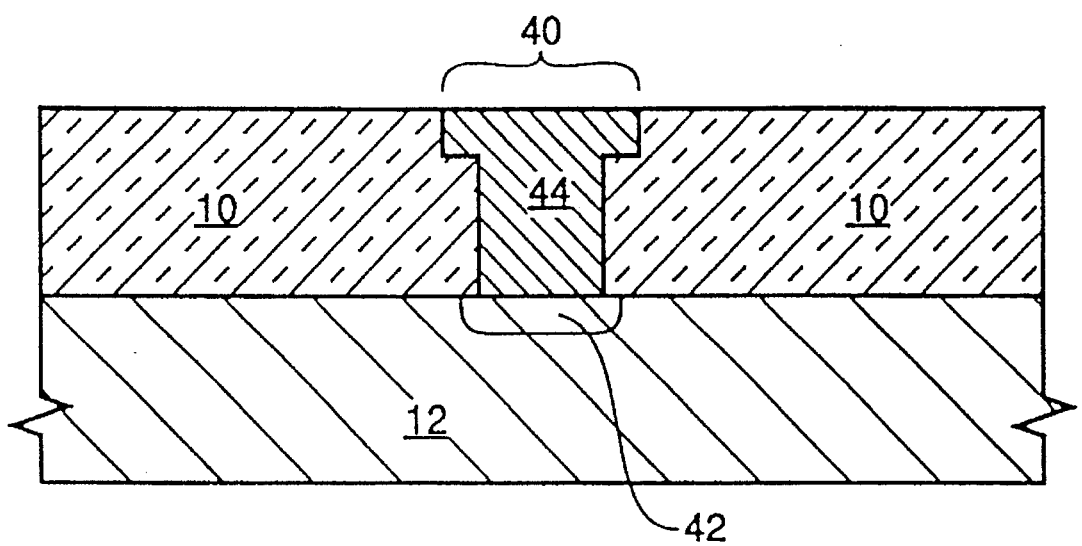
FIG. 4 is a cross section of a plug formed by a damascene process to contact an active area of a substrate.
Figure 5:
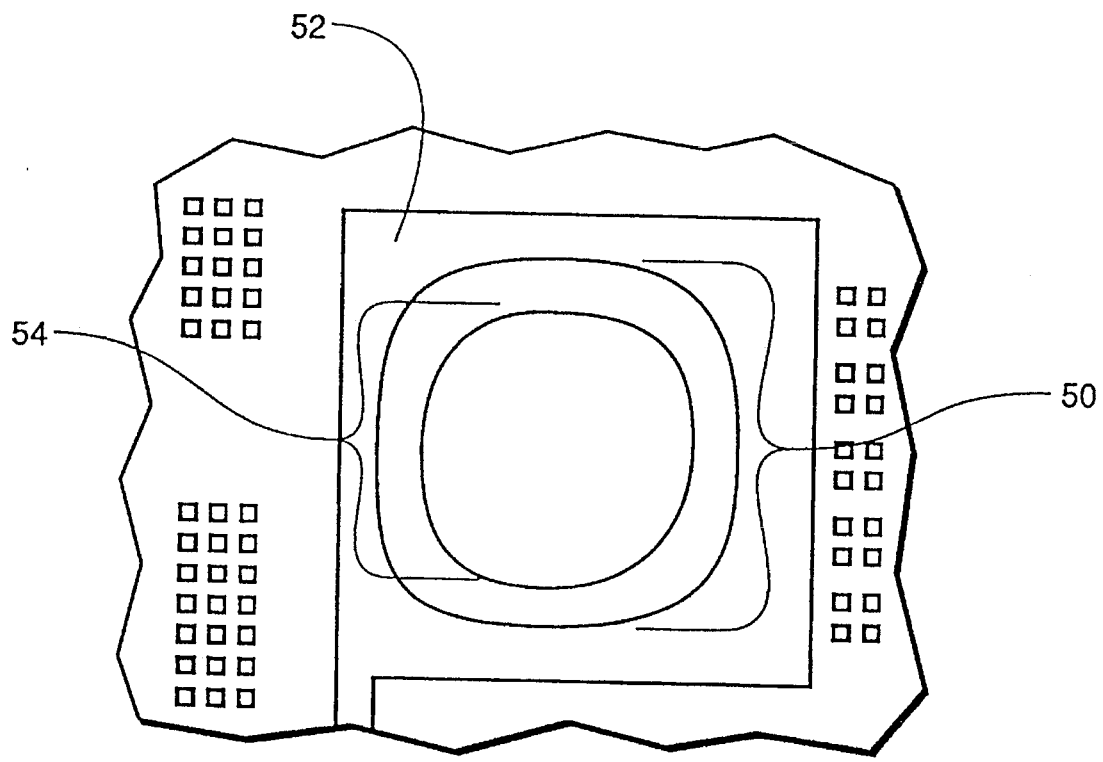
FIG. 5 is a top view optical micrograph showing the result of dishing which occurs with conventional damascene processes.
Figure 8:
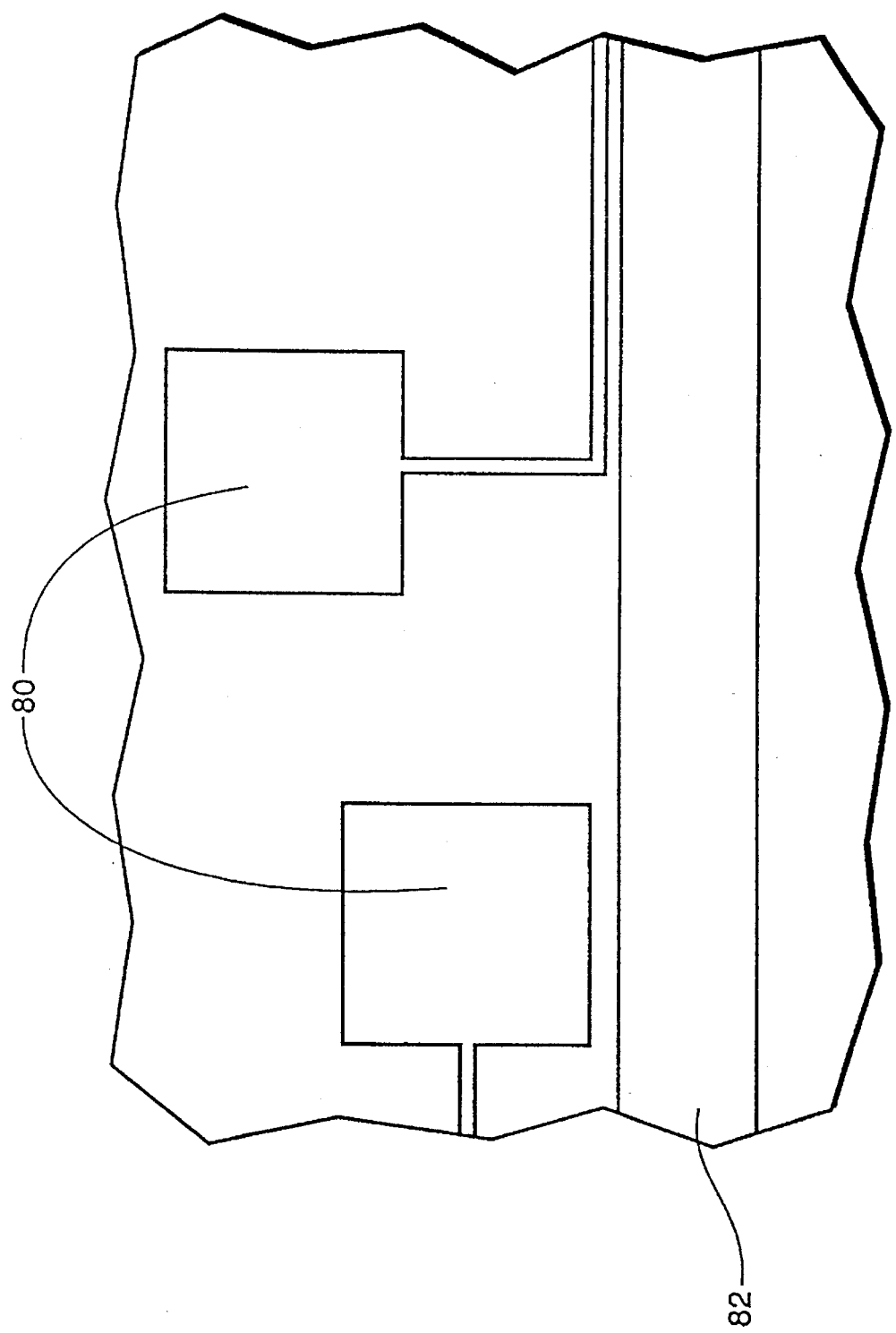
FIG. 8 is a top view optical micrograph showing non-dished features resulting from the inventive process.

Finally, the tungsten and remaining TEOS layers were etched by a CMP process optimized to tungsten polishing, thereby leaving the structure as shown in FIG. 3. FIG. 8 is a top view optical micrograph of a bond pad 80 and power bus 82 formed using the inventive process, with no dishing evident. Note that the variation in the size of the bond pads between FIGS. 5 and 8 result from magnification differences.

The slurry used to etch the tungsten and TEOS was highly selective to the tungsten, with a much smaller amount of the TEOS being removed. In the instant case the slurry was a solution comprising an alumina abrasive, 30% $H_2O_2$, and 70% water by volume and a polishing rate selectivity of 20:1 (tungsten:TEOS) was targeted and achieved, and the tungsten was removed at a rate of 1 KÅ–3 KÅ/min using the parameters herein. The wafer surface was polished until the tungsten overburden covering the oxide which defined the troughs was removed, thereby leaving tungsten inlaid in the oxide dielectric. With embodiments wherein another conductive material and/or protective layer is used, the slurry will be different. For example, using aluminum as the conductor and TEOS as the protector, a slurry of phosphoric acid can be used, and a polishing rate selectivity of 300:1 (aluminum:TEOS) has been achieved.

Using a conventional damascene process, the amount of dishing of a bond pad (a square of ≈100 $\mu$m/side with current technology) was found by surface profilometer to be 6 KÅ. A measurement of a bond pad formed using the inventive process showed that dishing was reduced to 2 KÅ.

Several parameters were found to affect the amount of dishing and/or the polishing rate. The elastic properties of the polishing pad was found to affect both the dishing and the removal rate of the conductor and protector. In general, the harder the pad the less the dishing. If a pad is excessively hard, however, the conductor may be scratched.

The concentration of the etchant in the slurry was found to significantly affect only the polishing rate. The higher the percentage of $H_2O_2$, the faster the polishing rate. With the instant case, the slurry comprised 10% to 35% $H_2O_2$ and 90% to 65% water by volume. The temperature of the etchant also affected only the polishing rate. A slurry temperature of between 70° C. and 100° C. was found to be sufficient with the slurry concentration described above. The slurry can be applied to the rotating wafer by continuous feed, or the wafer can be submerged in a "lake" of slurry using a dam around the polishing platen.

A sufficient rotational speed of the platen was found to be about 10–100 revolutions per minute (RPM), and an optimum was found to be about 25–35 RPM. The oscillation range of the carrier varied from 30 cm to 60 cm with a target of 50 cm, and the speed of the carrier across the platen was in the range of 20 to 35 cm/sec with 30 cm/sec being a target.

The pressure of the carrier against the platen was ranged from about 2 to 12 psi, and the carrier rotated at approximately 35–50 RPM.

To form a protruding feature, such as a protruding plug, a portion of the material surrounding the plug (usually oxide) may also be removed by a CMP or other process as an additional step. With a CMP process, a slurry which has a high oxide to plug removal rate would be used. Removal of about 1,000 Å of the material such as oxide surrounding a plug of a material such as tungsten should sufficiently expose the plug to allow for improved contact with a subsequent layer of a material such as sputtered aluminum.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

We claim:

1. A semiconductor processing method of minimizing chemical-mechanical polishing dishing in the formation of a planar outer surface having an electrically conductive area adjacent an insulating dielectric area on a semiconductor wafer, the method comprising the following steps:

providing a trough in a dielectric layer and thereby defining a non-planar wafer topography;

providing a conformal blanketing layer of a conductive material over the dielectric layer and within the trough;

providing a chemical-mechanical polishing protective layer over the conformal layer of conductive material, the protective layer being of different composition than the conformal conductive layer; and chemical-mechanical polishing the protective layer and conformal conductive layer in at least two chemical-mechanical polishing steps using first and second respective chemical-mechanical polishing slurries, the first chemical-mechanical polishing step and slurry removing outermost portions of the protective layer from said troughs in a manner which is substantially selective to the underlying conformal conductive layer to outwardly expose conformal conductive layer material in high topographical areas, the second chemical-mechanical polishing step and slurry removing the conformal conductive layer material at a faster rate than the protective layer material, the protective layer upon outward exposure of conformal conductive layer material in high topographical areas restricting material removal from low topographical areas during such second chemical-mechanical polishing step and thereby minimizing dishing of the conductive material within the trough.

2. The semiconductor processing method of claim 1 wherein the protective layer is formed of an electrically conductive material.

3. The semiconductor processing method of claim 1 wherein the protective layer is formed of an electrically insulative material.

4. The semiconductor processing method of claim 1 wherein the protective layer comprises titanium metal.

5. The semiconductor processing method of claim 1 wherein the protective layer comprises tungsten metal.

6. The semiconductor processing method of claim 1 wherein the protective layer comprises a combination of titanium metal and tungsten metal.

7. The semiconductor processing method of claim 1 wherein the protective layer comprises molybdenum.

8. The semiconductor processing method of claim 1 wherein the protective layer comprises tantalum.

9. The semiconductor processing method of claim 1 wherein the protective layer comprises tantalum nitride.

10. The semiconductor processing method of claim 1 wherein the protective layer comprises TEOS.

11. The semiconductor processing method of claim 1 wherein the protective layer comprises BPSG.

\* \* \* \* \*